United States Patent
Granger-Jones et al.

(10) Patent No.: US 10,992,270 B2
(45) Date of Patent: *Apr. 27, 2021

(54) POWER AMPLIFIER APPARATUS SUPPORTING REVERSE INTERMODULATION PRODUCT CANCELLATION

(71) Applicant: Qorvo US, Inc., Greensboro, NC (US)

(72) Inventors: Marcus Granger-Jones, Scotts Valley, CA (US); Dirk Robert Walter Leipold, San Jose, CA (US); Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/669,945

(22) Filed: Oct. 31, 2019

(65) Prior Publication Data

US 2020/0067468 A1    Feb. 27, 2020

Related U.S. Application Data

(63) Continuation of application No. 16/018,197, filed on Jun. 26, 2018, now Pat. No. 10,491,175.

(Continued)

(51) Int. Cl.
     *H03F 3/24*          (2006.01)
     *H03F 1/32*          (2006.01)
     (Continued)

(52) U.S. Cl.
     CPC ............... *H03F 3/24* (2013.01); *H03F 1/32* (2013.01); *H04B 1/0475* (2013.01); *H04B 1/1027* (2013.01)

(58) Field of Classification Search
     CPC ........... H03F 3/24; H03F 1/32; H04B 1/1027; H04B 1/0475
     See application file for complete search history.

(56) References Cited

U.S. PATENT DOCUMENTS

| | | |
|---|---|---|
| 10,491,175 B2 | 11/2019 | Granger-Jones et al. |
| 2001/0054932 A1 | 12/2001 | Oguro et al. |

(Continued)

OTHER PUBLICATIONS

Apple Inc., "R4-1803062: A-MPR for DC_41A_n41A," 3rd Generational Partnership Project (3GPP), TSG-RAN WG4 Meeting #86, Feb. 26-Mar. 2, 2018, 6 pages, Athens, Greece.

(Continued)

*Primary Examiner* — Syed Haider
(74) *Attorney, Agent, or Firm* — Withrow & Terranova, P.L.L.C.

(57) ABSTRACT

A power amplifier apparatus supporting reverse intermodulation product (rIMD) cancellation is provided. The power amplifier apparatus includes an amplifier circuit configured to amplify and output a radio frequency (RF) signal for transmission via an antenna port. The antenna port may receive a reverse interference signal, which may interfere with the RF signal to create a rIMD(s) that can fall within an RF receive band(s). A reverse coupling circuit is provided in the power amplifier apparatus to generate an interference cancellation signal based on the reverse interference signal. The amplifier circuit is configured to amplify the interference cancellation signal and the RF signal to create an intermodulation product(s) to suppress the rIMD(s) to a determined threshold. By suppressing the rIMD(s) in the power amplifier apparatus, it is possible to support concurrent transmissions and receptions in a number of RF spectrums while in compliance with stringent regulatory spurious emissions (SEM) requirements.

20 Claims, 13 Drawing Sheets

Related U.S. Application Data

(60) Provisional application No. 62/636,482, filed on Feb. 28, 2018.

(51) Int. Cl.
*H04B 1/10* (2006.01)
*H04B 1/04* (2006.01)

(56) References Cited

U.S. PATENT DOCUMENTS

| | | | |
|---|---|---|---|
| 2006/0091950 A1* | 5/2006 | Hayase | H03F 1/3247 330/149 |
| 2009/0027119 A1 | 1/2009 | Williams et al. | |
| 2011/0190028 A1* | 8/2011 | Hahn | H03F 3/24 455/550.1 |
| 2014/0051373 A1* | 2/2014 | Klomsdorf | H04B 1/0475 455/114.3 |
| 2016/0020737 A1* | 1/2016 | Kong | H01Q 21/28 455/73 |
| 2017/0264420 A1 | 9/2017 | Bharadia et al. | |

OTHER PUBLICATIONS

Non-Final Office Action for U.S. Appl. No. 16/018,197, dated Apr. 2, 2019, 8 pages.

Notice of Allowance for U.S. Appl. No. 16/018,197, dated Jul. 31, 2019, 9 pages.

\* cited by examiner

POWER AMPLIFIER APPARATUS SUPPORTING REVERSE INTERMODULATION PRODUCT CANCELLATION

RELATED APPLICATIONS

This application is a continuation of U.S. patent application Ser. No. 16/018,197, filed on Jun. 26, 2018, now U.S. Pat. No. 10,491,175, which claims the benefit of U.S. provisional patent application No. 62/636,482, filed on Feb. 28, 2018, the disclosures of which are hereby incorporated herein by reference in their entireties.

FIELD OF THE DISCLOSURE

The technology of the disclosure relates generally to amplifying radio frequency (RF) signals for transmission in RF spectrums.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences. The redefined user experience requires higher data rates offered by such advanced radio access technology (RAT) as long-term evolution (LTE) and fifth-generation new radio (5G-NR). To achieve the higher data rates, a mobile communication device often employs a power amplifier(s) to increase output power of radio frequency (RF) signals (e.g., maintaining sufficient energy per bit) communicated by mobile communication devices. In addition, the mobile communication device may employ a filter(s) and/or a coupler(s) in various processing stages along a signal transmission path(s) and a signal reception path(s).

The mobile communication device may be configured to transmit an LTE uplink RF signal(s) and a 5G-NR uplink RF signal(s) concurrently in an LTE transmit band and a 5G-NR transmit band (e.g., LTE uplink band 41 and 5G-NR uplink band 41) via an LTE antenna(s) and a 5G-NR antenna(s), respectively. Due to space constraint, the LTE antenna(s) and the 5G-NR antenna(s) may be collocated in close proximity in the mobile communication device. As a result, an RF signal transmitted from one antenna may be coupled to another antenna as a reverse interference signal. For example, the LTE RF signal(s) transmitted by the LTE antenna(s) may be coupled to the 5G-NR antenna(s) as a reverse interference signal, and vice versa. In this regard, the reverse interference signal received at an antenna port, which is coupled to the LTE antenna(s) and/or the 5G-NR antenna(s), can cause a number of reverse intermodulation products (rIMDs) being created (e.g., at an output of a power amplifier(s)). In a non-limiting example, a spectral density of the rIMDs can be as high as 5 dBm per MHz (dBm/MHz). If the rIMDs are not sufficiently suppressed, the rIMDs may be passed to the LTE antenna(s) and/or the 5G-NR antenna(s) and transmitted with the LTE RF signal(s) and/or the 5G-NR RF signal(s), thus causing the mobile communication device to fail regulatory spurious emissions (SEM) requirements.

Although it may be possible to employ additional filters to suppress the reverse interference signal and the rIMDs at the output of the power amplifier(s), it may be difficult to do so for certain LTE and 5G-NR bands with a non-contiguous RF band(s). For example, the LTE uplink/downlink band 41 and the 5G-NR uplink/downlink band 41 each occupies 194 MHz of non-contiguous RF band. Thus, it may be desirable to suppress the rIMDs in the mobile communication device prior to transmitting from the LTE antenna(s) and the 5G-NR antenna(s) to support concurrent LTE and 5G-NR transmission and reception in both contiguous and non-contiguous RF bands.

SUMMARY

Aspects disclosed in the detailed description include a power amplifier apparatus supporting reverse intermodulation product (rIMD) cancellation. The power amplifier apparatus includes an amplifier circuit configured to amplify and output a radio frequency (RF) signal for transmission via an antenna port. The antenna port may receive a reverse interference signal (e.g., coupled to the antenna port from another transmitting antenna), which may interfere with the RF signal to create a rIMD(s) that can fall within an RF receive band(s). A reverse coupling circuit is provided in the power amplifier apparatus to generate an interference cancellation signal based on the reverse interference signal (e.g., with opposing phase and proportional amplitude relative to the reverse interference signal). The amplifier circuit is configured to amplify the interference cancellation signal and the RF signal to create an intermodulation product(s) to suppress the rIMD(s) to a determined threshold. By suppressing the rIMD(s) in the power amplifier apparatus prior to outputting the RF signal to the antenna port, it is possible to support concurrent transmissions and receptions in a number of RF spectrums while in compliance with stringent regulatory spurious emissions (SEM) requirements.

In one aspect, a power amplifier apparatus is provided. The power amplifier apparatus includes an antenna port coupled to at least one antenna. The power amplifier apparatus also includes an amplifier circuit comprising an amplifier input and an amplifier output. The amplifier circuit is configured to amplify an RF signal received via the amplifier input and provide the RF signal to the antenna port via the amplifier output. The power amplifier apparatus also includes a reverse coupling circuit provided in parallel to the amplifier circuit between the antenna port and the amplifier input. The power amplifier apparatus also includes a control circuit. The control circuit is configured to determine whether a rIMD exists at the amplifier output. The control circuit is also configured to activate the reverse coupling circuit to generate and provide an interference cancellation signal to the amplifier input to suppress the rIMD to a defined threshold in response to determining that the rIMD exists at the amplifier output.

In another aspect, a power amplifier apparatus is provided. The power amplifier apparatus includes an antenna port coupled to at least one antenna. The power amplifier apparatus also includes an amplifier circuit comprising an amplifier input and an amplifier output, the amplifier circuit is configured to amplify an RF signal received via the amplifier input and provide the RF signal to the antenna port via the amplifier output. The power amplifier apparatus also includes a reverse coupling circuit provided in parallel to the amplifier circuit between the antenna port and the amplifier input. The reverse coupling circuit is configured to generate and provide an interference cancellation signal to the amplifier input. The amplifier circuit is further configured to generate at least one IMD at the amplifier output based on the interference cancellation signal to suppress at least one rIMD to a defined threshold.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1:
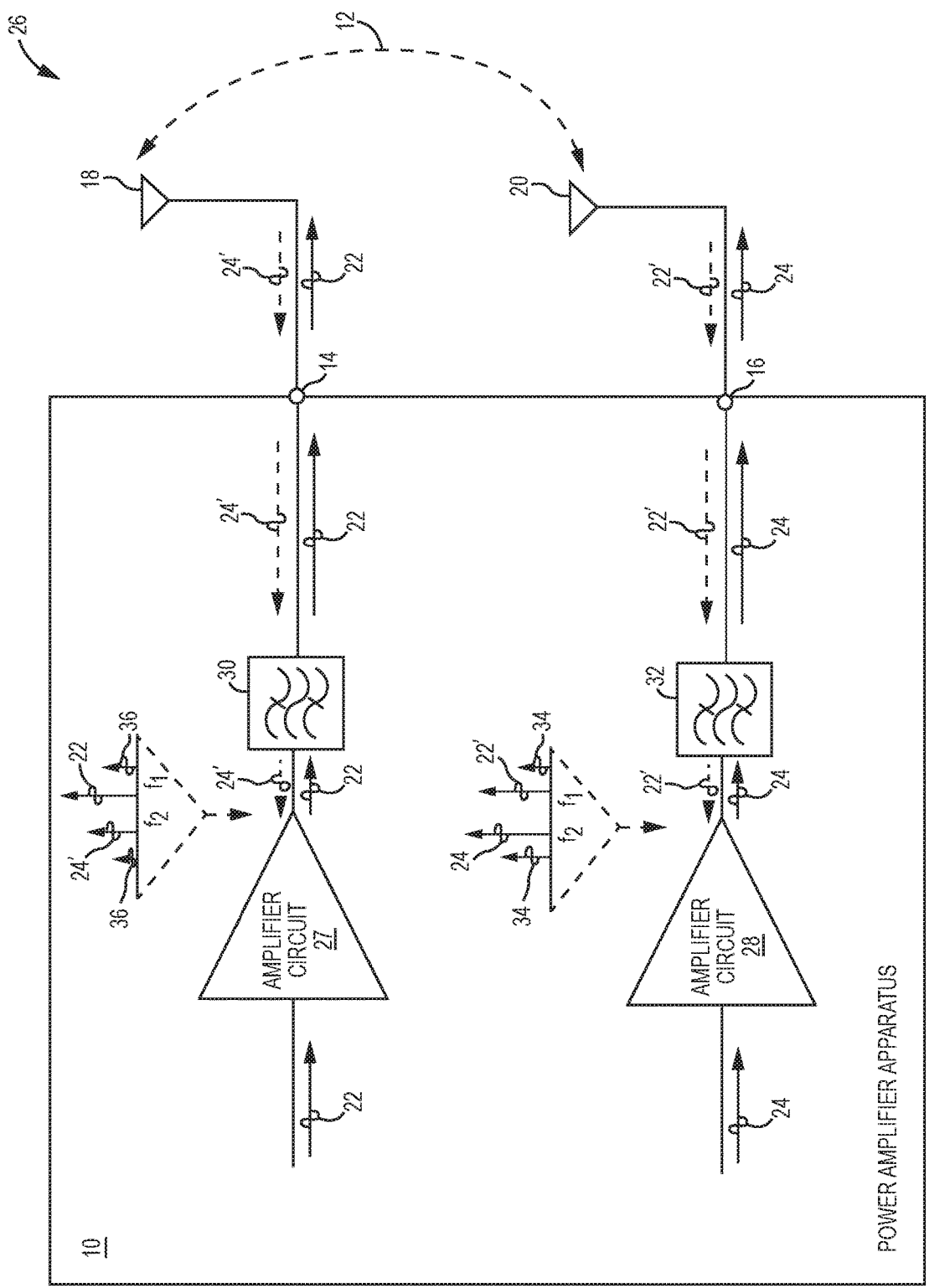
FIG. 1 is a schematic diagram of an exemplary existing power amplifier apparatus that may create a number of reverse intermodulation products (rIMDs) as a result of antenna coupling between a pair of antenna ports.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a power amplifier apparatus supporting reverse intermodulation product (rIMD) cancellation. The power amplifier apparatus includes an amplifier circuit configured to amplify and output a radio frequency (RF) signal for transmission via an antenna port. The antenna port may receive a reverse interference signal (e.g., coupled to the antenna port from another transmitting antenna), which may interfere with the RF signal to create a rIMD(s) that can fall within an RF receive band(s). A reverse coupling circuit is provided in the power amplifier apparatus to generate an interference cancellation signal based on the reverse interference signal (e.g., with opposing phase and proportional amplitude relative to the reverse interference signal). The amplifier circuit is configured to amplify the interference cancellation signal and the RF signal to create an intermodulation product(s) to suppress the rIMD(s) to a determined threshold. By suppressing the rIMD(s) in the power amplifier apparatus prior to outputting the RF signal to the antenna port, it is possible to support concurrent transmissions and receptions in a number of RF spectrums while in compliance with stringent regulatory spurious emissions (SEM) requirements.

Before discussing the power amplifier apparatus of the present disclosure, a brief overview of an existing power amplifier apparatus is first discussed with reference to FIG. 1 to help understand the cause and the consequence of rIMD(s) in the existing power amplifier apparatus. The discussion of specific exemplary aspects of the power amplifier apparatus supporting rIMD cancellation according to the present disclosure starts below with reference to FIG. 2.

FIG. 1 is a schematic diagram of an exemplary existing power amplifier apparatus 10 that may create a number of rIMDs that can occur as a result of an antenna coupling 12 between a first antenna port 14 and a second antenna port 16. In a non-limiting example, the first antenna port 14 and the second antenna port 16 are coupled to a first antenna(s) 18 and a second antenna(s) 20 for transmitting concurrently a first RF signal 22 and a second RF signal 24 in a first frequency $f_1$ and a second frequency $f_2$, respectively. The first RF signal 22 and the second RF signal 24 may be a long-term evolution (LTE) signal and a fifth-generation new-radio (5G-NR) signal configured to be transmitted concurrently in LTE uplink band 41 and 5G-NR uplink band 41, respectively.

Notably, the existing power amplifier apparatus 10 may be provided in a mobile communication device 26 (e.g., a smartphone) having stringent space constraints. As a result, the first antenna(s) 18 and the second antenna(s) 20 may have to be disposed in close proximity in the mobile communication device 26. In addition to the lack of physical separation between the first antenna(s) 18 and the second antenna(s) 20, there may also be insufficient RF isolation between the first antenna port 14 and the second antenna port 16. As a result, the first RF signal 22 transmitted from the first antenna(s) 18 may be coupled to the second antenna(s) 20 as a first reverse interference signal 22'. The first reverse interference signal 22' may have a different phase and/or amplitude relative to the first RF signal 22, but occupies the same RF band as the first RF signal 22 (e.g., in the first frequency $f_1$). Likewise, the second RF signal 24 transmitted from the second antenna(s) 20 may be coupled to the first antenna(s) 18 as a second reverse interference signal 24'. The second reverse interference signal 24' may have a different phase and/or amplitude relative to the second RF signal 24, but occupies the same RF band as the second RF signal 24 (e.g., in the second frequency $f_2$).

The existing power amplifier apparatus 10 includes a first amplifier circuit 27 and a second amplifier circuit 28 configured to receive and amplify the first RF signal 22 and the second RF signal 24, respectively. The existing power amplifier apparatus 10 also includes a first transmit filter 30 and a second transmit filter 32 configured to pass the first RF signal 22 and the second RF signal 24, respectively. Notably, in the example that the first RF signal 22 and the second RF signal 24 are transmitted in the LTE uplink band 41 and 5G-NR uplink band 41, the first RF signal 22, the first reverse interference signal 22', the second RF signal 24, and the second reverse interference signal 24' are falling into the same 194 MHz non-contiguous RF band of the LTE band 41 and the 5G-NR band 41. As a result, the first transmit filter 30 is unable to stop the second reverse interference signal 24' and the second transmit filter 32 is unable to stop the first reverse interference signal 22'.

Consequently, the first reverse interference signal 22' can interfere with the second RF signal 24 to create a number of second rIMDs 34 (e.g., third-order rIMD (rIMD3), fifth-order rIMD (rIMD5), and so on), while the second reverse interference signal 24' can interfere with the first RF signal 22 to create a number of first rIMDs 36 (e.g., rIMD3, rIMD5, and so on). The first rIMDs 36 and/or the second rIMDs 34 may fall within the same 194 MHz non-contiguous RF bands, thus desensing the receiver(s) configured to receive LTE and/or 5G-NR downlink RF signals in the same 194 MHz non-contiguous RF bands.

Although it may be possible to employ additional filters to suppress the first rIMDs 36 and/or the second rIMDs 34 in the mobile communication device 26, it may be difficult to do so in the entire 194 MHz non-contiguous RF bands. For example, the third-generation partnership project (3GPP) and the Federal Communications Commission (FCC) requires that SEM in the LTE band 41 and the 5G-NR band 41 to be −30 dBm/MHz and −25 dBm/MHz, respectively. According to measurements published by 3GPP, the rIMD3 for a typical state of the art RF front end is approximately 4 dBm/MHz when no additional maximum power reduction (A-MPR) is applied. In this regard, to satisfy the −30 dBm/MHz SEM requirement, a 15 dB A-MPR would be required. However, it may be undesirable to implement such a large A-MPR in the mobile communication device 26. As such, it may be desirable to adequately suppress the first rIMDs 36 and the second rIMDs 34 in the existing power amplifier apparatus 10 to satisfy the SEM requirements without requiring the large A-MPR.

Figure 2:
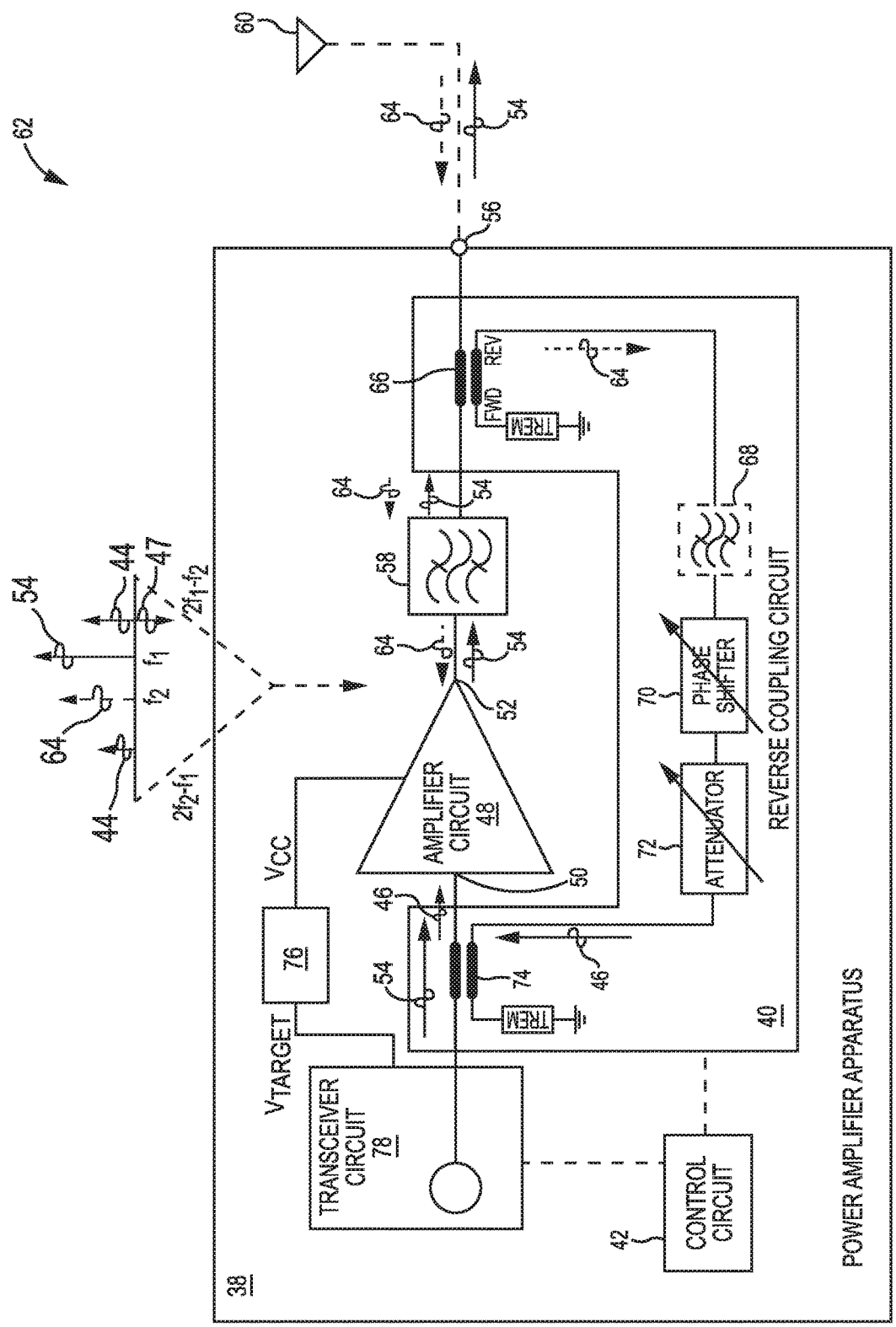
FIG. 2 is a schematic diagram of an exemplary power amplifier apparatus configured to support rIMD cancellation according to one embodiment of the present disclosure.

In this regard, FIG. 2 is a schematic diagram of an exemplary power amplifier apparatus 38 configured to support rIMD cancellation according to one embodiment of the present disclosure. As discussed in detail below, the power amplifier apparatus 38 includes a reverse coupling circuit 40 and a control circuit 42. The control circuit 42, which can be implemented by a microprocessor, a microcontroller, or a field-programmable gate array (FPGA) for example, is configured to determine whether there exists at least one rIMD 44 (e.g., rIMD3, rIMD5, and so on) in the power amplifier apparatus 38. In a non-limiting example, the control circuit 42 can be preconfigured to predict whether the rIMD 44 exists based on predetermined characteristics (e.g., frequency band, power level, modulation, etc.) of the first RF signal 22 and/or the second RF signal 24. Such known characteristics may be pre-stored in the control circuit 42 or communicated to the control circuit 42 dynamically. In another non-limiting example, the control circuit 42 can include an rIMD detector to dynamically determine existence of the rIMD 44. In case the rIMD 44 is determined to exist, the control circuit 42 then activates the reverse coupling circuit 40 to generate an interference cancellation signal 46. The interference cancellation signal 46 is amplified to generate at least one IMD 47, which has substantially opposing phase and substantially similar amplitude relative to the rIMD 44, to help suppress the rIMD 44 to a defined threshold. In a non-limiting example, the defined threshold can be determined based on the SEM requirements and/or design specifications. By suppressing the rIMD 44 to the defined threshold, it is possible to support concurrent transmissions and receptions in a number of RF bands (e.g., LTE band 41 and 5G-NR band 41) in compliance with the stringent 3GPP and FCC SEM requirements.

The power amplifier apparatus 38 includes an amplifier circuit 48. The amplifier circuit 48 includes an amplifier input 50 and an amplifier output 52. The amplifier circuit 48 is configured to receive an RF signal 54, which may be similar to the first RF signal 22 or the second RF signal 24 of FIG. 1, via the amplifier input 50. The amplifier circuit 48 is also configured to amplify the RF signal 54 and output the RF signal 54 via the amplifier output 52. In examples discussed hereinafter, the RF signal 54 is configured to be transmitted at frequency $f_1$.

The amplifier output 52 is coupled to an antenna port 56 via a transmit filter 58. The transmit filter 58 is configured to pass the RF signal 54 to the antenna port 56. The antenna port 56 may be coupled to at least one antenna 60 configured to transmit the RF signal 54 in RF bands such as the LTE band 41 or the 5G-NR band 41.

Notably, the power amplifier apparatus 38 may be provided in a communication device 62 (e.g., a mobile communication device) including other antennas for concurrently transmitting/receiving same or different RF signals in the same RF bands such as the LTE band 41 or the 5G-NR band 41. As a result, a reverse interference signal 64 may be received by the antenna port 56 and propagates from the antenna port 56 toward the amplifier output 52. In examples discussed hereinafter, the reverse interference signal 64 can appear at frequency $f_2$. The reverse interference signal 64 can interfere with the RF signal 54 to create the rIMD 44 at the amplifier output 52. In a non-limiting example, the rIMD 44 can be a pair of third order rIMDs (rIMD3s) appearing at frequencies $2f_1-f_2$ and $2f_2-f_1$, respectively. As illustrated in FIG. 2, the rIMD3 located at frequency $2f_1-f_2$ is closer to the frequency $f_1$ of the RF signal 54. Moreover, in a non-limiting example, the rIMD3 at frequency $2f_1-f_2$ is also stronger than the 4IMD3 at frequency $2f_2-f_1$. In this regard, the rIMD3 at frequency $2f_1-f_2$ is hereinafter referred to as a "stronger rIMD." Accordingly, the interference cancellation signal 46 is amplified to generate the IMD 47, which has substantially opposing phase and substantially similar amplitude relative to the stronger rIMD 44, to help suppress the rIMD 44 to the defined threshold.

The reverse coupling circuit 40 is coupled in parallel to the amplifier circuit 48 between the antenna port 56 and the amplifier input 50. In a non-limiting example, the reverse coupling circuit 40 includes a first directional coupler 66 coupled between the transmit filter 58 and the antenna port 56. The first directional coupler 66 is configured to couple the reverse interference signal 64 from the antenna port 56 to the reverse coupling circuit 40. In a non-limiting example, the first directional coupler 66 has a coupling factor (CF) of approximately 15-20 dB.

The reverse coupling circuit 40 may include a filter 68, which may be a fixed filter or a tunable filter, coupled to the first directional coupler 66. The filter 68 is configured to match a group delay of the reverse coupling circuit 40 with a group delay of the transmit filter 58. The reverse coupling circuit 40 includes a phase shifter 70 coupled to the filter 68 and an attenuator 72 coupled to the phase shifter 70. The reverse coupling circuit 40 further includes a second directional coupler 74 coupled between the amplifier input 50 and the attenuator 72. In a non-limiting example, the second directional coupler 74 has a CF of approximately 10 dB. The second directional coupler 74 is configured to couple the interference cancellation signal 46 to the amplifier input 50. Accordingly, the amplifier circuit 48 amplifies the interference cancellation signal 46 and the RF signal 54 concurrently. Due to inherent non-linearity of the amplifier circuit 48, the amplifier circuit 48 can create the IMD 47 at the amplifier output 52.

Notably, to be able to suppress the rIMD 44 to the defined threshold, the IMD 47 needs to have substantially opposing phase and substantially similar amplitude relative to the rIMD 44. In this regard, the control circuit 42 may adjust the phase shifter 70 and/or the attenuator 72 to convert the reverse interference signal 64 into the interference cancellation signal 46. More specifically, the control circuit 42 adjusts the phase shifter 70 and the attenuator 72 such that the interference cancellation signal 46 can have opposing phase and proportional amplitude relative to the reverse interference signal 64. In a non-limiting example, the opposing phase and the proportional amplitude relative to the reverse interference signal 64 (also referred to as "predetermined configuration parameters") can be pre-generated (e.g., via a calibration process) and pre-stored (e.g., in a look-up table). The control circuit 42 may retrieve the predetermined configuration parameters from the look-up table and configure the phase shifter 70 and the attenuator 72 accordingly. Thus, by generating the interference cancellation signal 46 having the opposing phase and the proportional amplitude relative to the reverse interference signal 64, it is possible for the amplifier circuit 48 to create the IMD 47 to suppress the rIMD 44 to the defined threshold.

In a non-limiting example, the control circuit 42 may adjust the attenuator 72 such that the interference cancellation signal 46 can have smaller amplitude relative to the amplitude of the reverse interference signal 64. In this regard, the amplifier circuit 48 can amplify the interference cancellation signal 46 to the substantially similar amplitude relative to the reverse interference signal 64. To help determine optimal phase and optimal amplitude for the interference cancellation signal 46, the control circuit 42 may continuously measure the rIMD 44 at the amplifier output 52 and compare the measured rIMD 44 against the defined threshold. Accordingly, the control circuit 42 may adjust the phase shifter 70 and/or the attenuator 72 in one or more iterations until the rIMD 44 is suppressed to the defined threshold. At this point, the interference cancellation signal 46 is said to have the substantially opposing phase and the proportional amplitude relative to the reverse interference signal 64. Accordingly, the IMD 47 is said to have the substantially opposing phase and the substantially similar amplitude relative to the rIMD 44.

Various measurements indicate that, by generating the IMD 47 having the substantially opposing phase and the substantially similar amplitude relative to the rIMD 44, it may be possible to suppress the rIMD 44 by up to 18 dB, with the amplifier circuit 48 configured to operate at +27 dBm on a 3 dB compression curve. The power amplifier apparatus 38 may also be adjusted to effectively suppress the rIMD 44 at different degrees of compression of the amplifier circuit 48. Further, the power amplifier apparatus 38 remains effective in suppressing the rIMD 44 independent of modulated bandwidth of the RF signal 54.

The reverse coupling circuit 40 may be configured to generate the interference cancellation signal 46 to suppress a single rIMD, such as rIMD3 or rIMD5. The reverse coupling circuit 40 may also be configured to generate the interference cancellation signal 46 to suppress multiple rIMDs, such as rIMD3 and rIMD5, concurrently.

The power amplifier apparatus 38 includes a tracker circuit 76 and a transceiver circuit 78. The tracker circuit 76 is configured to generate an envelope tracking (ET) modulated voltage $V_{CC}$ based on a target voltage $V_{TARGET}$. The ET modulated voltage VCC is provided to the amplifier circuit 48 for amplifying the RF signal 54. The transceiver circuit 78, which can include both digital and analog circuitries, is configured to generate and provide the target voltage $V_{TARGET}$ to the tracker circuit 76. The transceiver circuit 78 is further configured to receive and provide the RF signal 54 to the amplifier circuit 48.

The power amplifier apparatus 38 may be implemented in a variety of configurations, as discussed next with reference to FIGS. 3A-3H, without compromising the effectiveness in suppressing the rIMD 44. Common elements between FIGS. 2 and 3A-3H are shown therein with common element numbers and will not be re-described herein.

Figure 3A:
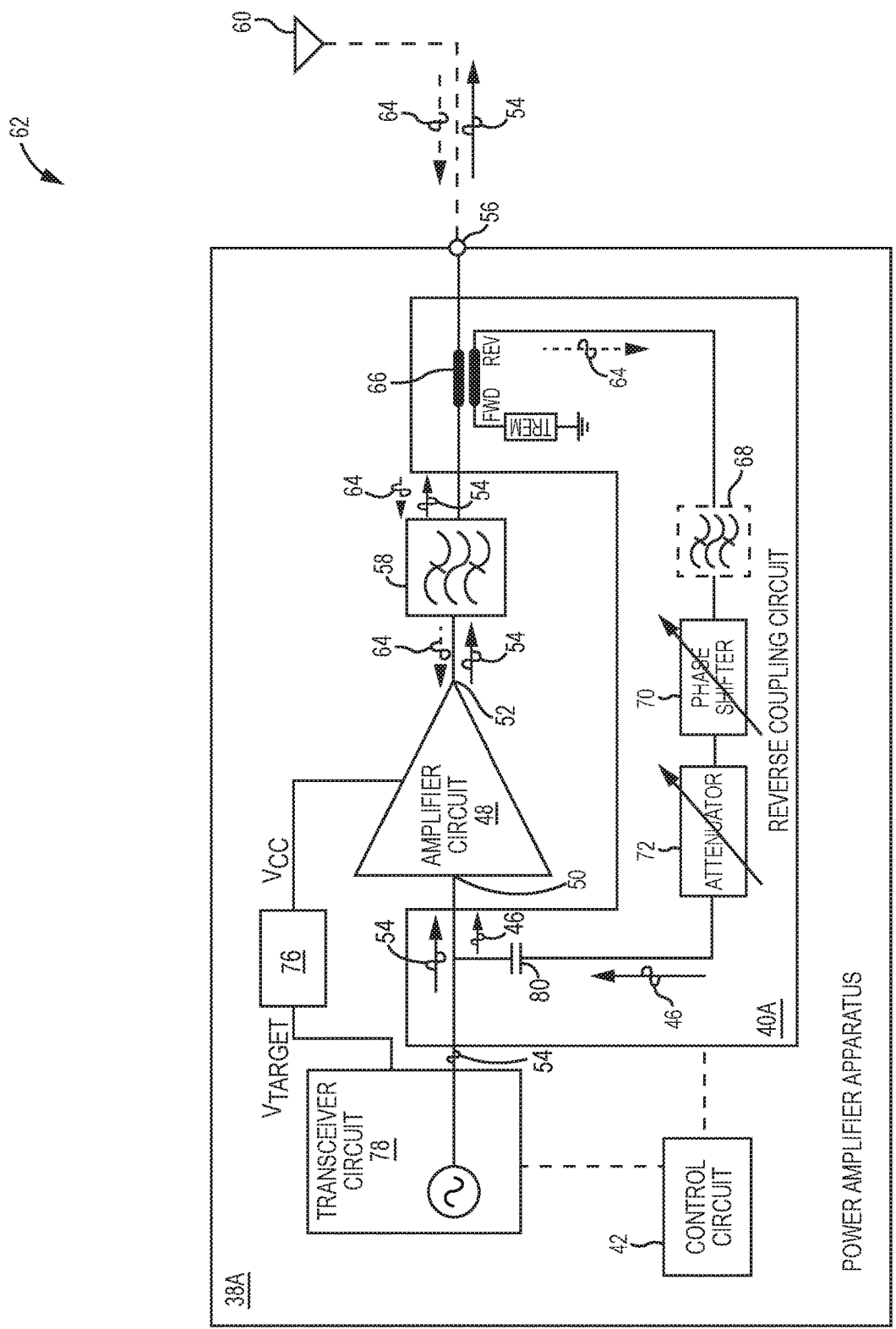
FIG. 3A is a schematic diagram of an exemplary power amplifier apparatus configured to support rIMD cancellation according to another embodiment of the present disclosure.

FIG. 3A is a schematic diagram of an exemplary power amplifier apparatus 38A configured to support rIMD cancellation according to another embodiment of the present disclosure. The power amplifier apparatus 38A includes a reverse coupling circuit 40A. In contrast to the reverse coupling circuit 40 of FIG. 2, the reverse coupling circuit 40A is coupled to the amplifier input 50 via a coupling element 80. In a non-limiting example, the coupling element 80 may be a capacitor, a resistor, an inductor, or mutual coupling of inductors.

Figure 3B:
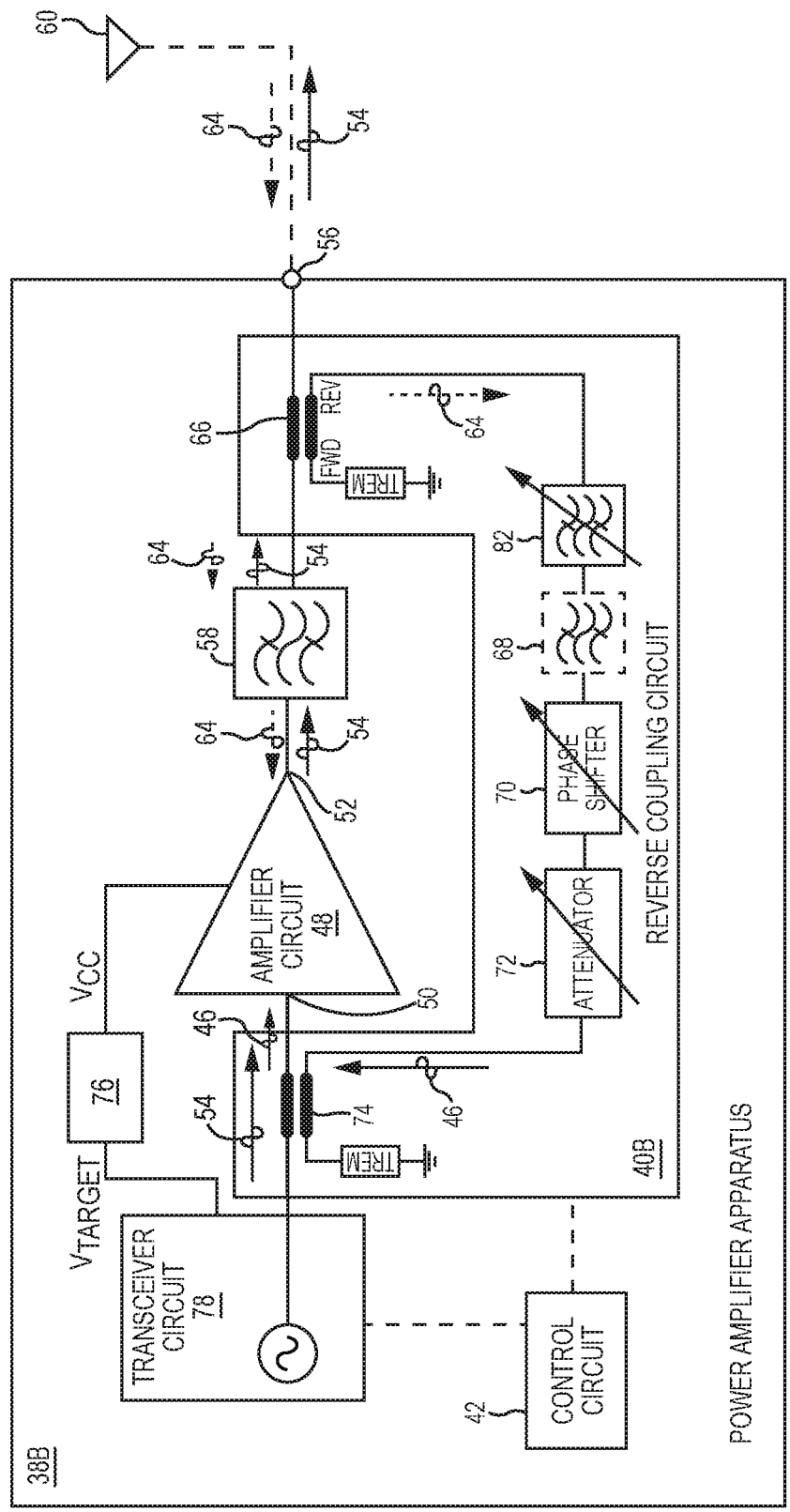
FIG. 3B is a schematic diagram of an exemplary power amplifier apparatus configured to support rIMD cancellation according to another embodiment of the present disclosure.

FIG. 3B is a schematic diagram of an exemplary power amplifier apparatus 38B configured to support rIMD cancellation according to another embodiment of the present disclosure. The power amplifier apparatus 38B includes a reverse coupling circuit 40B. In contrast to the reverse coupling circuit 40 of FIG. 2, the reverse coupling circuit 40B further includes a tunable band stop filter 82 coupled between the filter 68 and the first directional coupler 66.

Notably, under antenna voltage standing wave ratio (VSWR) conditions, the effective directivity of the first directional coupler 66 may be degraded. For example, if the antenna 60 is at a 3:1 VSWR condition, approximately 6 dB power of the RF signal 54 may be reflected back towards the amplifier circuit 48, and thus becomes a "reverse power." In this regard, the "reflected power" can potentially degrade the first directional coupler 66 from more than 20 dB to about 6 dB. As such, the RF signal 54 may be coupled back to the amplifier circuit 48 via the reverse coupling circuit 40B, thus degrading the RF signal 54.

In this regard, the control circuit 42 can adjust the tunable band stop filter 82 to block a leakage of the RF signal 54 that may be coupled from the antenna port 56 into the reverse coupling circuit 40B. By blocking the leakage of the RF signal 54, it may be possible to prevent the leakage from being re-modulated with the RF signal 54. As a result, it may be possible to ensure that the RF signal 54 is not degraded under various VSWR conditions at the antenna 60.

Figure 3C:
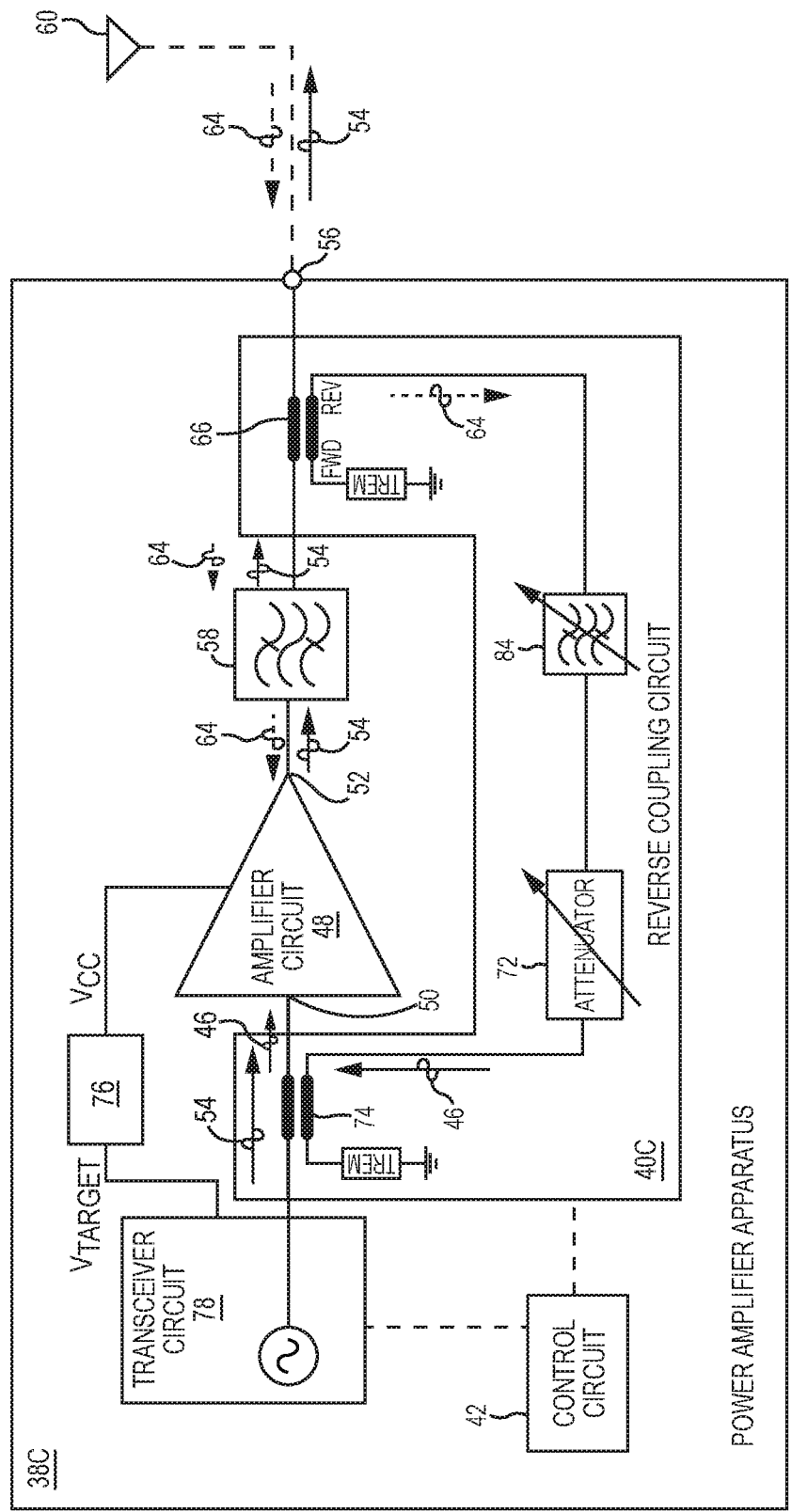
FIG. 3C is a schematic diagram of an exemplary power amplifier apparatus configured to support rIMD cancellation according to another embodiment of the present disclosure.

FIG. 3C is a schematic diagram of an exemplary power amplifier apparatus 38C configured to support rIMD cancellation according to another embodiment of the present disclosure. The power amplifier apparatus 38C includes a reverse coupling circuit 40C. In contrast to the reverse coupling circuit 40 of FIG. 2, the reverse coupling circuit 40C includes a tunable filter 84 coupled between the first directional coupler 66 and the attenuator 72. The tunable filter 84 may be adjusted by the control circuit 42 to pass exclusively the reverse interference signal 64. In addition, the control circuit 42 may also adjust the tunable filter 84 to convert the reverse interference signal 64 into the interference cancellation signal 46 having the opposing phase and the proportional amplitude relative to the reverse interference signal 64.

Figure 3D:
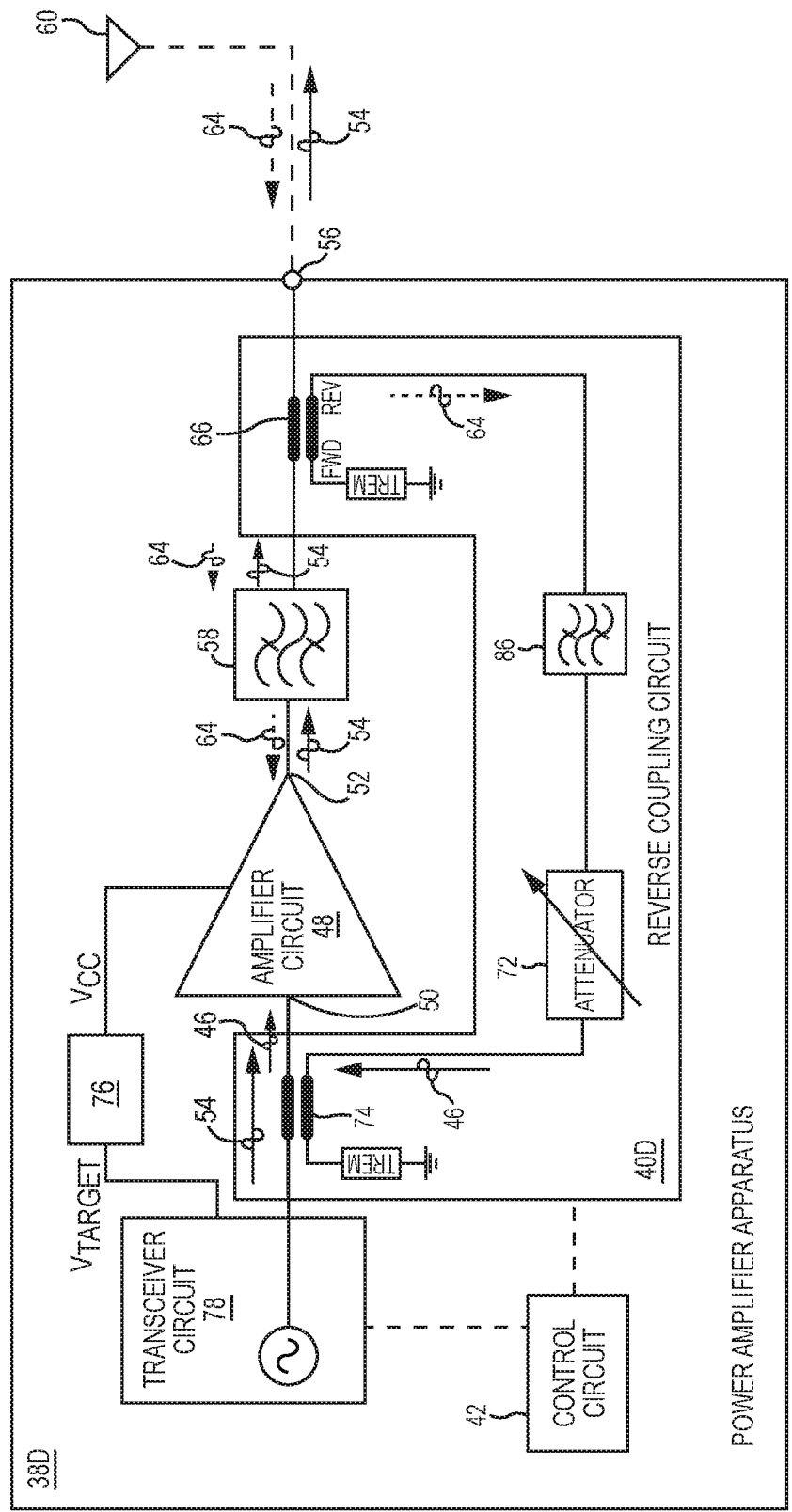
FIG. 3D is a schematic diagram of an exemplary power amplifier apparatus configured to support rIMD cancellation according to another embodiment of the present disclosure.

FIG. 3D is a schematic diagram of an exemplary power amplifier apparatus 38D configured to support rIMD cancellation according to another embodiment of the present disclosure. The power amplifier apparatus 38D includes a reverse coupling circuit 40D. In contrast to the reverse coupling circuit 40C of FIG. 3C, the reverse coupling circuit 40D includes a fixed filter 86 coupled between the first directional coupler 66 and the attenuator 72. The control circuit 42 may pre-configure the fixed filter 86 and adjust the attenuator 72 to convert the reverse interference signal 64 into the interference cancellation signal 46 having the opposing phase and the proportional amplitude relative to the reverse interference signal 64.

Figure 3E:
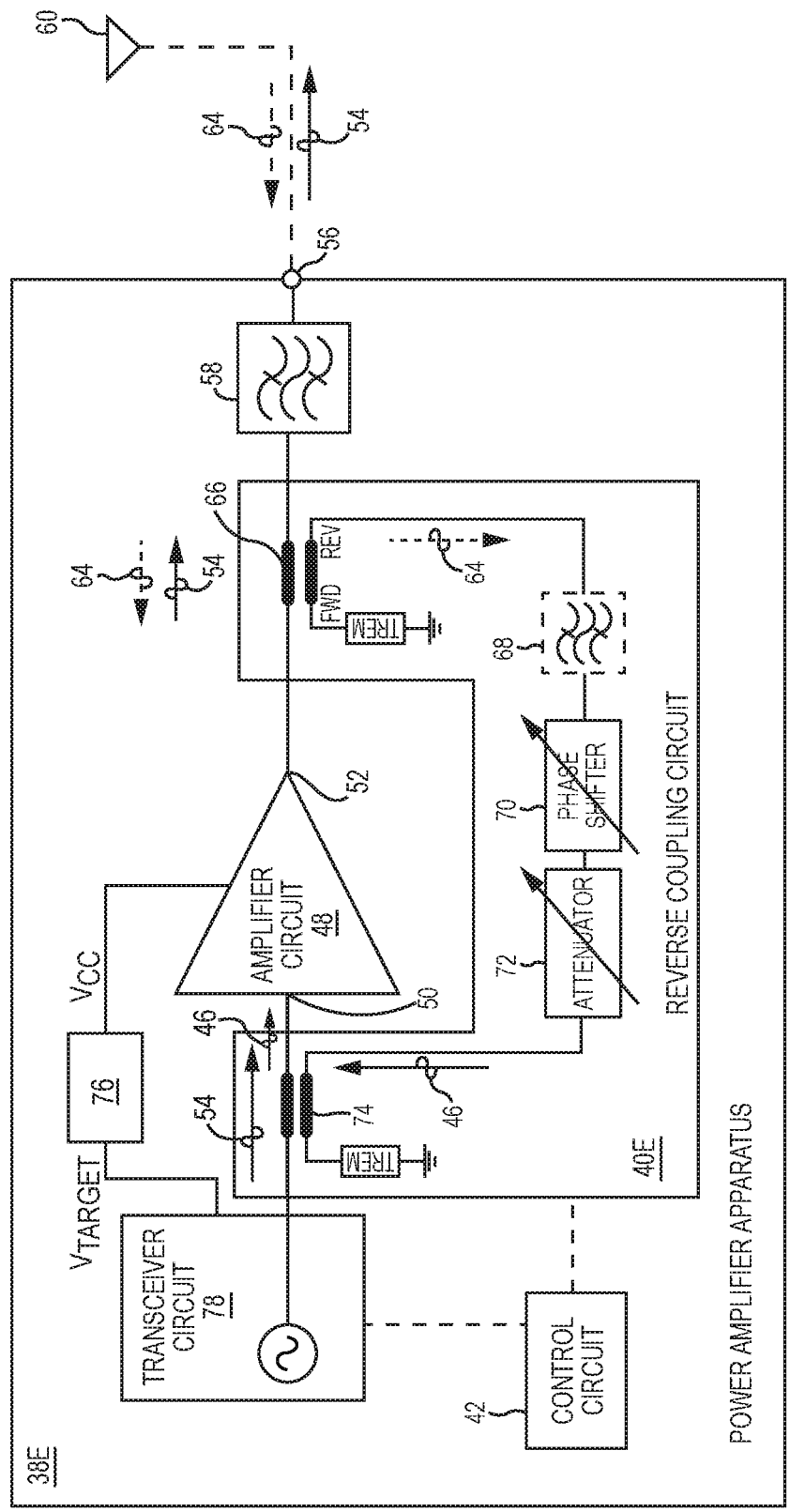
FIG. 3E is a schematic diagram of an exemplary power amplifier apparatus configured to support rIMD cancellation according to another embodiment of the present disclosure.

FIG. 3E is a schematic diagram of an exemplary power amplifier apparatus 38E configured to support rIMD cancellation according to another embodiment of the present disclosure. The power amplifier apparatus 38E includes a reverse coupling circuit 40E. In contrast to the reverse coupling circuit 40 of FIG. 2, the first directional coupler 66 is coupled between the amplifier output 52 and the transmit filter 58. In this regard, the first directional coupler 66 is coupled to the antenna port 56 via the transmit filter 58.

Figure 3F:
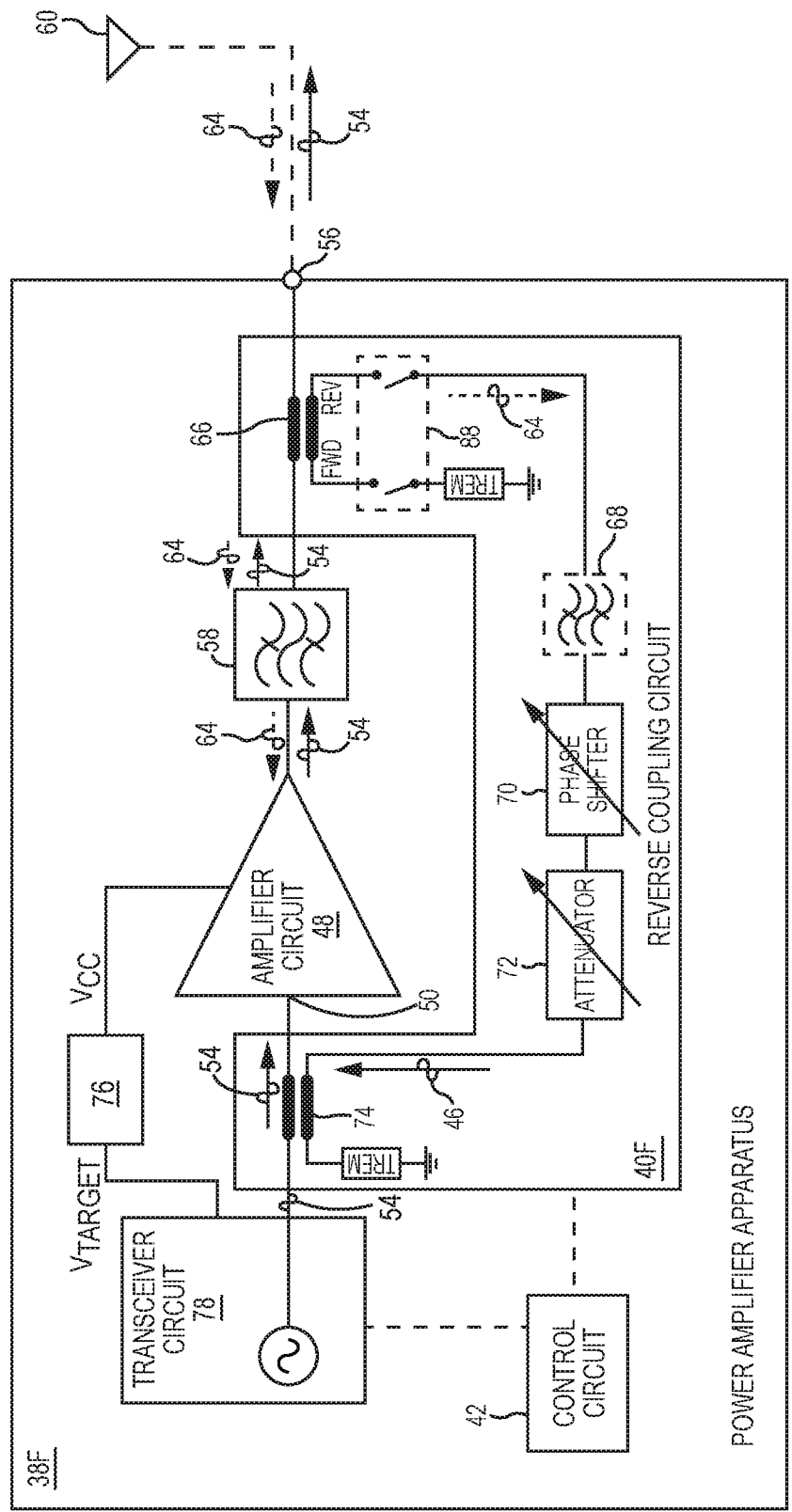
FIG. 3F is a schematic diagram of an exemplary power amplifier apparatus configured to support rIMD cancellation according to another embodiment of the present disclosure.

FIG. 3F is a schematic diagram of an exemplary power amplifier apparatus 38F configured to support rIMD cancellation according to another embodiment of the present disclosure. The power amplifier apparatus 38F includes a reverse coupling circuit 40F. In contrast to the reverse coupling circuit 40 of FIG. 2, the reverse coupling circuit 40F includes a switch circuit 88 coupled between the first directional coupler 66 and the filter 68. In a non-limiting example, the switch circuit 88 can be integrated with the first directional coupler 66 to form a smart coupler circuit. In this regard, the control circuit 42 can control the switch circuit 88 to activate the reverse coupling circuit 40F in response to determining that the rIMD 44 exists at the amplifier output 52. In contrast, the control circuit 42 can also control the switch circuit 88 to deactivate the reverse coupling circuit 40F in response to determining that the rIMD 44 does not exist at the amplifier output 52.

Figure 3G:
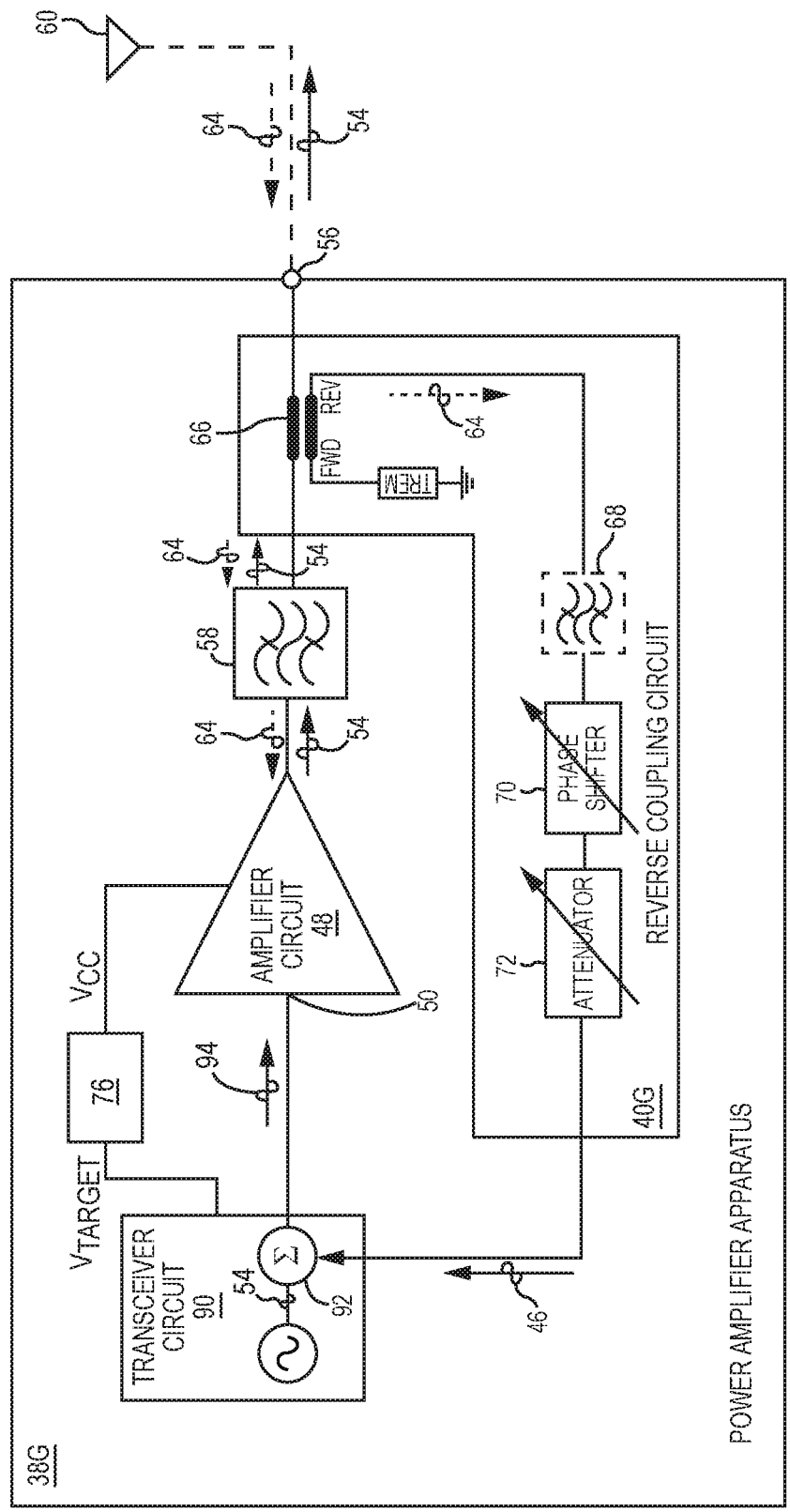
FIG. 3G is a schematic diagram of an exemplary power amplifier apparatus configured to support rIMD cancellation according to another embodiment of the present disclosure.

FIG. 3G is a schematic diagram of an exemplary power amplifier apparatus 38G configured to support rIMD cancellation according to another embodiment of the present disclosure. The power amplifier apparatus 38G includes a reverse coupling circuit 40G and a transceiver circuit 90. The transceiver circuit 90 is functionally equivalent to the transceiver circuit 78 in FIG. 2 and includes a signal combiner 92. In contrast to the reverse coupling circuit 40 of FIG. 2, the reverse coupling circuit 40G is coupled to the signal combiner 92 without the second directional coupler 74. The signal combiner 92 is configured to combine the RF signal 54 with the interference cancellation signal 46 to generate a combined forward signal 94 and provide the combined forward signal 94 to the amplifier circuit 48 for generating the IMD 47 at the amplifier output 52.

Figure 3H:
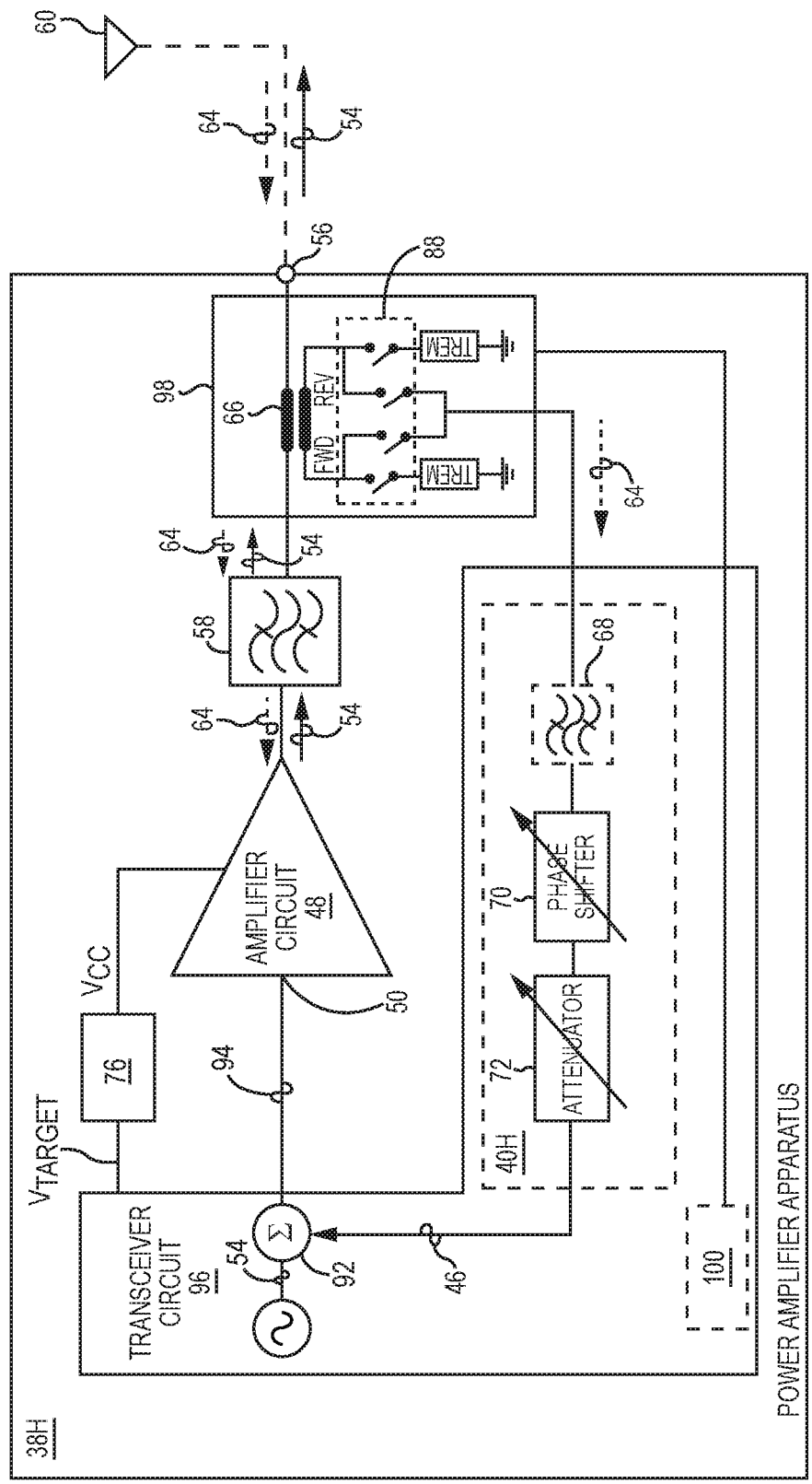
FIG. 3H is a schematic diagram of an exemplary power amplifier apparatus configured to support rIMD cancellation according to another embodiment of the present disclosure.

FIG. 3H is a schematic diagram of an exemplary power amplifier apparatus 38H configured to support rIMD cancellation according to another embodiment of the present disclosure. The power amplifier apparatus 38H includes a reverse coupling circuit 40H, a transceiver circuit 96, and a directional coupler circuit 98. The directional coupler circuit 98 includes the first directional coupler 66 and the switch circuit 88. The directional coupler circuit 98 may be coupled to a transmit control circuit 100, which is configured to perform transmit power control and VSWR estimation. In a non-limiting example, the reverse coupling circuit 40H is integrated into the transceiver circuit 96. The reverse coupling circuit 40H is coupled to the directional coupler circuit 98 to receive the reverse interference signal 64.

Figure 4A:
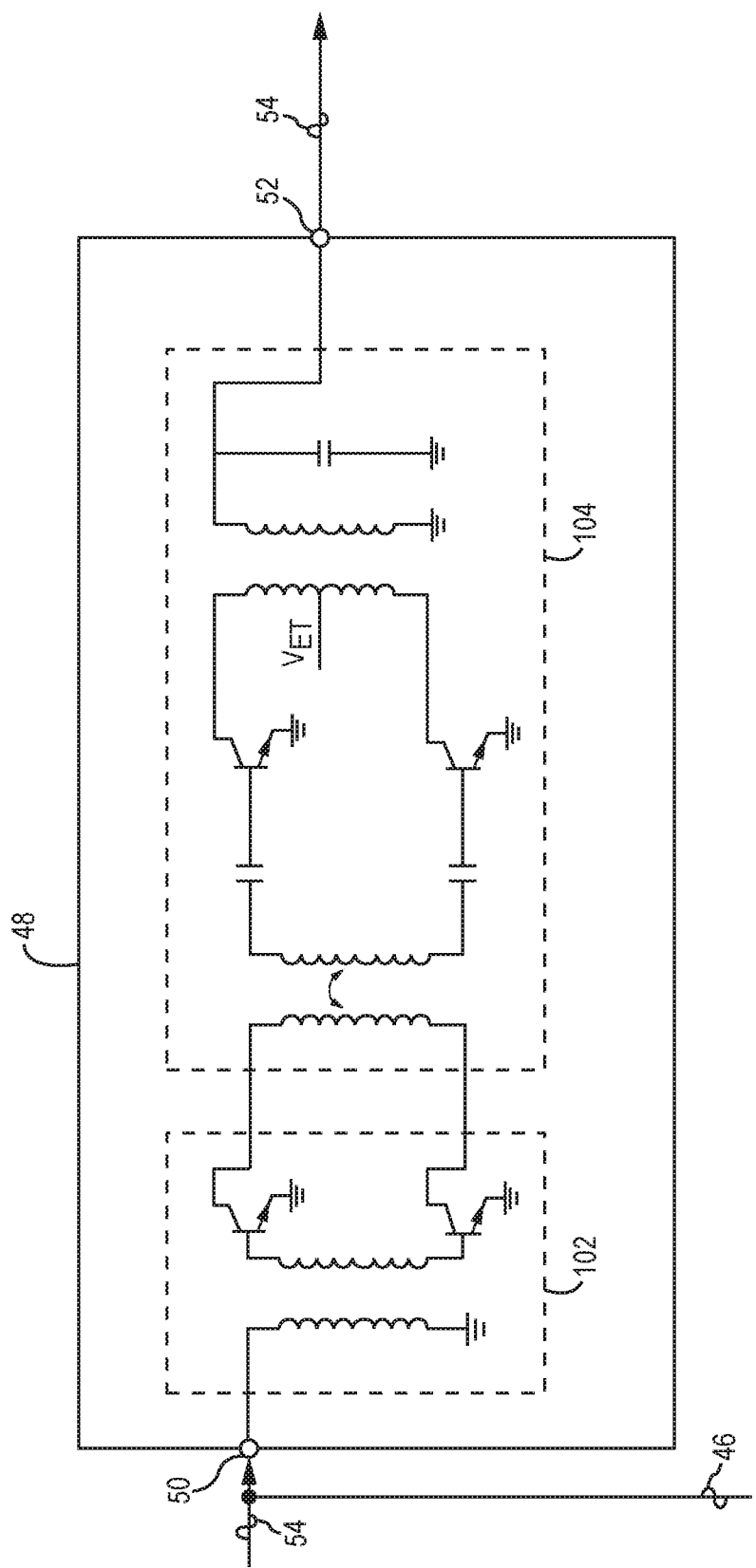
FIG. 4A is a schematic diagram providing an exemplary illustration of an amplifier circuit employed in the power amplifier apparatus of FIG. 2 according to one configuration of the present disclosure.

FIG. 4A is a schematic diagram providing an exemplary illustration of the amplifier circuit 48 in FIG. 2 according to one configuration of the present disclosure. Common elements between FIGS. 2 and 4A are shown therein with common element numbers and will not be re-described herein.

The amplifier circuit 48 may include an input stage 102 and an output stage 104. In a non-limiting example, the reverse coupling circuit 40 in FIG. 2 can be configured to provide the interference cancellation signal 46 to the input stage 102 of the amplifier circuit 48 via the amplifier input 50.

Figure 4B:
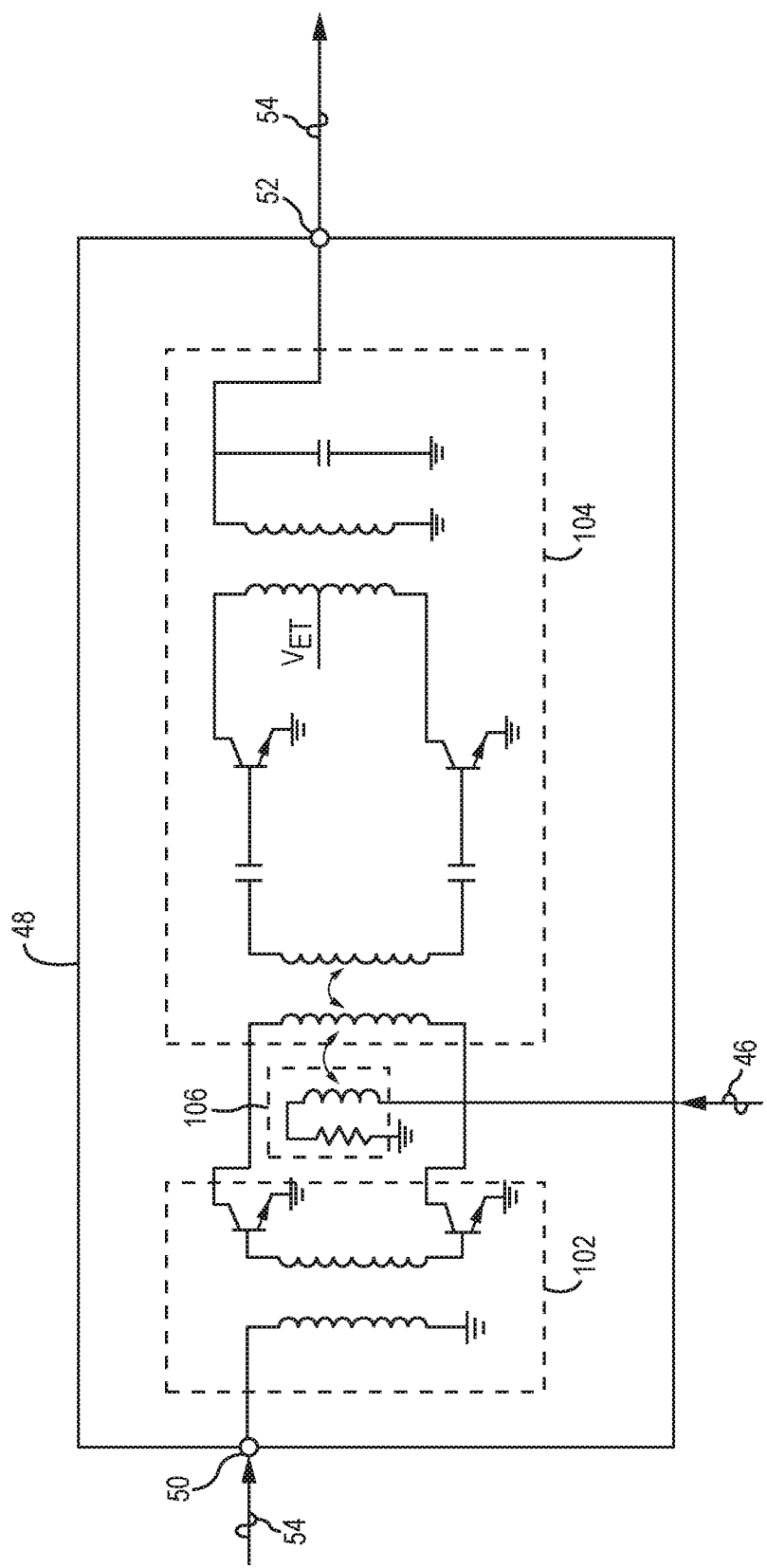
FIG. 4B is a schematic diagram providing an exemplary illustration of an amplifier circuit employed in the power amplifier apparatus of FIG. 2 according to another configuration of the present disclosure.

FIG. 4B is a schematic diagram providing an exemplary illustration of the amplifier circuit 48 in FIG. 2 according to another configuration of the present disclosure. Common elements between FIGS. 4A and 4B are shown therein with common element numbers and will not be re-described herein. As shown in FIG. 4B, the reverse coupling circuit 40 may be coupled to a matching network 106 coupled to the output stage 104.

Figure 5:
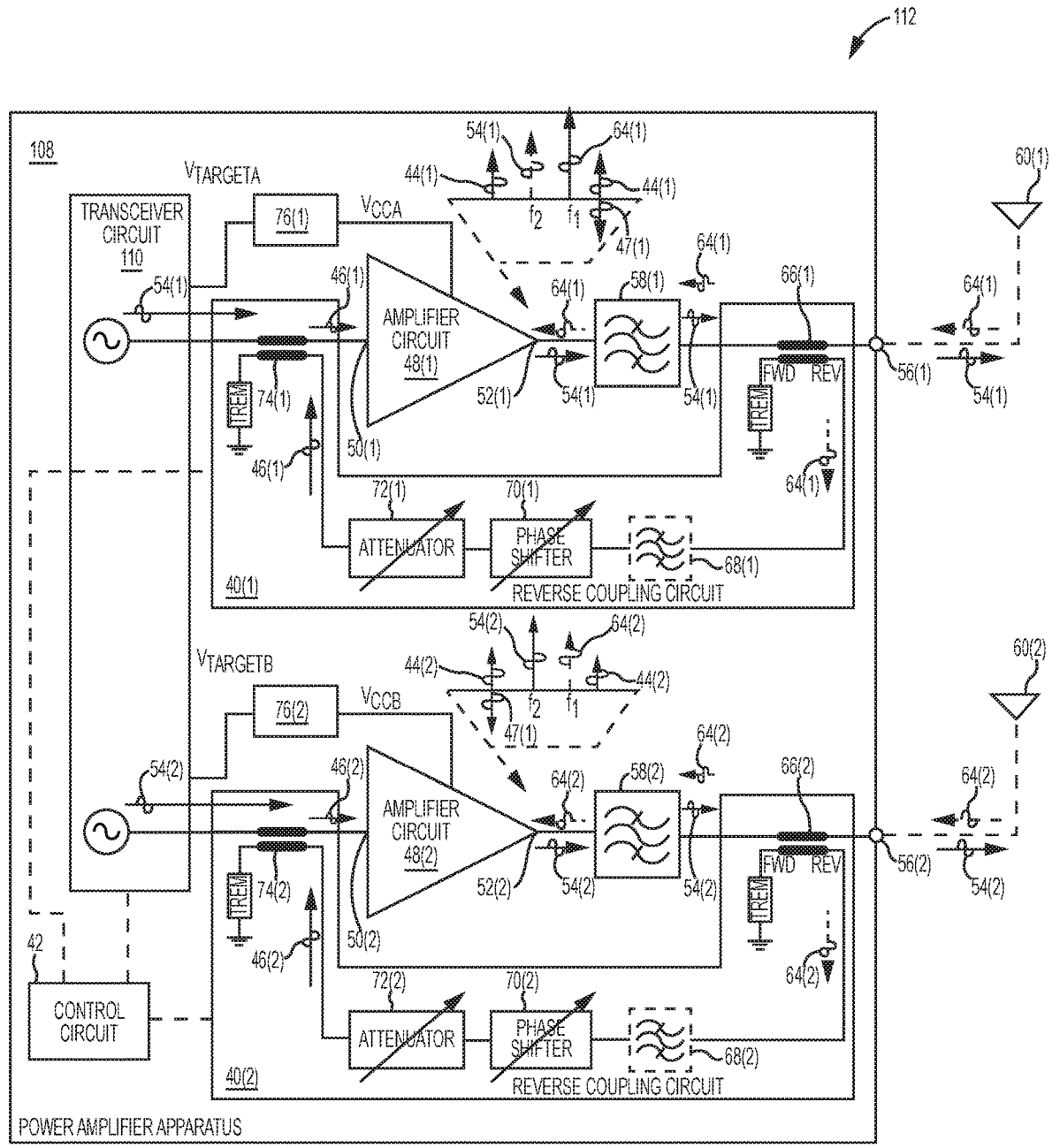
FIG. 5 is a schematic diagram of an exemplary power amplifier apparatus employing a pair of reverse coupling circuits to suppress a number of rIMDs resulted from antenna couplings between a pair of antenna ports.

The reverse coupling circuit 40 of FIG. 2 can be provided in the existing power amplifier apparatus 10 of FIG. 1 to suppress the rIMDs resulting from couplings between two concurrently transmitting antennas. In this regard, FIG. 5 is a schematic diagram of an exemplary power amplifier apparatus 108 employing a first reverse coupling circuit 40(1) and a second reverse coupling circuit 40(2) to suppress at least one first rIMD 44(1) and at least one second rIMD 44(2) resulted from antenna couplings between a first antenna port 56(1) and a second antenna port 56(2). Common elements between FIGS. 2 and 5 are shown therein with common element numbers and will not be re-described herein.

The power amplifier apparatus 108 includes a first amplifier circuit 48(1) and a second amplifier circuit 48(2) that are functionally equivalent to the amplifier circuit 48 of FIG. 2. The first amplifier circuit 48(1) includes a first amplifier input 50(1) and a first amplifier output 52(1). The second amplifier circuit 48(2) includes a second amplifier input 50(2) and a second amplifier output 52(2). The first amplifier output 52(1) is coupled to the first antenna port 56(1) via a first transmit filter 58(1). The second amplifier output 52(2) is coupled to the second antenna port 56(2) via a second transmit filter 58(2). Both the first transmit filter 58(1) and the second transmit filter 58(2) are functionally equivalent as the transmit filter 58 in FIG. 2.

The first antenna port 56(1) and the second antenna port 56(2) are coupled to at least one first antenna 60(1) and at least one second antenna 60(2), respectively. In this regard, the power amplifier apparatus 108 is configured to provide a first RF signal 54(1) and a second RF signal 54(2) to the first antenna port 56(1) and the second antenna port 56(2) for concurrent transmission via the first antenna 60(1) and the second antenna 60(2), respectively. The power amplifier apparatus 108 includes a transceiver circuit 110 configured to provide the first RF signal 54(1) and the second RF signal 54(2) to the first amplifier circuit 48(1) and the second amplifier circuit 48(2), respectively. In addition, the transceiver circuit 110 is also configured to prepare a first target voltage $V_{TARGETA}$ and a second target voltage $V_{TARGETB}$ to a first tracker circuit 76(1) and a second tracker circuit 76(2), respectively. The first tracker circuit 76(1) is configured to generate and provide a first ET modulated voltage $V_{CCA}$ to the first amplifier circuit 48(1) for amplifying the first RF signal 54(1). The second tracker circuit 76(2) is configured to generate and provide a second ET modulated voltage $V_{CCB}$ to the second amplifier circuit 48(2) for amplifying the second RF signal 54(2). In one embodiment, the power amplifier apparatus 108 can be configured to support a multiple-input multiple-output (MIMO) operation. In this regard, the first RF signal 54(1) and the second RF signal 54(2) may be encoded with different information, but transmitted concurrently in an identical carrier frequency. In another embodiment, the power amplifier apparatus 108 can be configured to concurrently support multiple radio access technologies (RATs), such as LTE and 5G-NR. In this regard, the first RF signal 54(1) and the second RF signal 54(2) may be encoded with different radio access technologies (RATs) and transmitted concurrently in different carrier frequencies.

As previously described in FIG. 1, the power amplifier apparatus 108 may be provided in a mobile communication device 112 (e.g., smartphone) having stringent space constrains. As such, the first antenna 60(1) and the second antenna 60(2) may have to be collocated in close proximity, which can result in antenna coupling between the first antenna port 56(1) and the second antenna port 56(2). As a result, the first RF signal 54(1) transmitted from the first antenna 60(1) may be coupled to the second antenna port 56(2) as a second reverse interference signal 64(2). The second reverse interference signal 64(2) interferes with the second RF signal 54(2) to create the second rIMD 44(2) at the second amplifier output 52(2). Likewise, the second RF signal 54(2) transmitted from the second antenna 60(2) may be coupled to the first antenna port 56(1) as a first reverse interference signal 64(1). The first reverse interference signal 64(1) interferes with the first RF signal 54(1) to create the first rIMD 44(1) at the first amplifier output 52(1).

To help suppress the first rIMDs 44(1), the first reverse coupling circuit 40(1) is coupled between the first antenna port 56(1) and the first amplifier input 50(1) to generate a first interference cancellation signal 46(1). The first reverse coupling circuit 40(1) includes a first-first directional coupler 66(1), a first filter 68(1), a first phase shifter 70(1), a first attenuator 72(1), and a first-second directional coupler 74(1) that are functionally equivalent to the first directional coupler 66, the filter 68, the phase shifter 70, the attenuator 72, and the second directional coupler 74 in FIG. 2, respectively. Accordingly, the first amplifier circuit 48(1) generates at least one first IMD 47(1) based on the first interference cancellation signal 46(1) to suppress the first rIMD 44(1).

To help suppress the second rIMDs 44(2), the second reverse coupling circuit 40(2) is coupled between the second antenna port 56(2) and the second amplifier input 50(2) to generate a second interference cancellation signal 46(2). The second reverse coupling circuit 40(2) includes a second-first directional coupler 66(2), a second filter 68(2), a second phase shifter 70(2), a second attenuator 72(2), and a second-second directional coupler 74(2) that are functionally equivalent to the first directional coupler 66, the filter 68, the phase shifter 70, the attenuator 72, and the second directional coupler 74 in FIG. 2, respectively. Accordingly, the second amplifier circuit 48(2) generates at least one second IMD 47(2) based on the second interference cancellation signal 46(2) to suppress the second rIMD 44(2).

Notably, the first reverse coupling circuit 40(1) and the second reverse coupling circuit 40(2) can be configured to suppress the first rIMD 44(1) and the second rIMD 44(2), respectively, in a broad RF band, such as the 194 MHz RF band allocated to LTE band 41 and 5G-NR band 41. In this regard, the control circuit 42 may control the first transmit filter 58(1) and the first filter 68(1) such that a respective group delay of the first transmit filter 58(1) is aligned with a respective group delay of the first reverse coupling circuit 40(1). Alternatively, the control circuit 42 may control the first transmit filter 58(1) and the first phase shifter 70(1) to align the respective group delay of the first transmit filter 58(1) with the respective group delay of the first reverse coupling circuit 40(1).

Likewise, the control circuit 42 may control the second transmit filter 58(2) and the second filter 68(2) such that a respective group delay of the second transmit filter 58(2) is aligned with a respective group delay of the second reverse coupling circuit 40(2). Alternatively, the control circuit 42 may control the second transmit filter 58(2) and the second phase shifter 70(2) to align the respective group delay of the second transmit filter 58(2) with the respective group delay of the second reverse coupling circuit 40(2).

In a non-limiting example, the first RF signal 54(1) and the second RF signal 54(2) can be an LTE signal and a 5G-NR signal, respectively. In this regard, the power amplifier apparatus 108 can be configured to support a variety of combinations of LTE band and 5G-NR band.

In one example, the first RF signal 54(1) and the second RF signal 54(2) can be modulated for transmission in LTE band 71 (B71) and 5G-NR band 71 (N71), respectively. In another example, the first RF signal 54(1) and the second RF signal 54(2) can be modulated for transmission in LTE band 41 (B41) and 5G-NR band 41 (N41), respectively. In another example, the first RF signal 54(1) and the second RF signal 54(2) can be modulated for transmission in LTE band 42 (B42) and 5G-NR band 78 (N78), respectively. In another example, the first RF signal 54(1) and the second RF signal 54(2) can be modulated for transmission in LTE band 42 (B42) and 5G-NR band 77 (N77), respectively. In another example, the first RF signal 54(1) and the second RF signal 54(2) can be modulated for transmission in LTE band 3 (B3) and 5G-NR band 80 (N80), respectively. In another example, the first RF signal 54(1) and the second RF signal 54(2) can be modulated for transmission in LTE band 8 (B8) and 5G-NR band 81 (N81), respectively. In another example, the first RF signal 54(1) and the second RF signal 54(2) can be modulated for transmission in LTE band 20 (B20) and 5G-NR band 82 (N82), respectively. In another example, the first RF signal 54(1) and the second RF signal 54(2) can be modulated for transmission in LTE band 28 (B28) and 5G-NR band 83 (N83), respectively. In another example, the first RF signal 54(1) and the second RF signal 54(2) can be modulated for transmission in LTE band 1 (B1) and 5G-NR band 84 (N84), respectively. In yet another example, the first RF signal 54(1) and the second RF signal 54(2) can be modulated for transmission in LTE band 41 (B41) and 5G-NR band 85 (N85), respectively. Table 1 below provides a list of RF spectrums of the LTE bands that may be supported by the power amplifier apparatus 108.

TABLE 1

| LTE Band | LTE Uplink Spectrum |
| --- | --- |
| B1 | 1920-1980 MHz |
| B3 | 1710-1785 MHz |
| B8 | 880-915 MHz |
| B20 | 832-862 MHz |
| B28 | 703-748 MHz |
| B41 | 2496-2690 MHz |

TABLE 1-continued

| LTE Band | LTE Uplink Spectrum |
| --- | --- |
| B42 | 3400-3600 MHz |
| B71 | 663-698 MHz |

Those skilled in the art will recognize improvements and modifications to the embodiments of the present disclosure. All such improvements and modifications are considered within the scope of the concepts disclosed herein and the claims that follow.

What is claimed is:

1. A power amplifier apparatus comprising:
an antenna port coupled to at least one antenna;
an amplifier circuit comprising an amplifier input and an amplifier output, the amplifier circuit configured to amplify a radio frequency (RF) signal received via the amplifier input and provide the RF signal to the antenna port via the amplifier output for transmission via the at least one antenna; and
a control circuit configured to:
determine whether at least one reverse intermodulation product (rIMD) exists at the amplifier output based on predetermined characteristics of the RF signal; and
cause the at least one rIMD to be suppressed to a defined threshold at the antenna port in response to determining that the at least one rIMD exists at the amplifier output.

2. The power amplifier apparatus of claim 1 further comprising a reverse coupling circuit provided in parallel to the amplifier circuit between the antenna port and the amplifier input, wherein the control circuit is further configured to activate the reverse coupling circuit to generate and provide an interference cancellation signal to the amplifier input to suppress the at least one rIMD to the defined threshold.

3. The power amplifier apparatus of claim 2 wherein the control circuit is further configured to configure the reverse coupling circuit based on predetermined parameters to suppress the at least one rIMD to the defined threshold.

4. The power amplifier apparatus of claim 2 wherein the control circuit is further configured to activate or deactivate the reverse coupling circuit via a switch circuit.

5. The power amplifier apparatus of claim 2 wherein:
the amplifier circuit further comprises an input stage and an output stage coupled to the input stage; and
the reverse coupling circuit is configured to provide the interference cancellation signal to the input stage.

6. The power amplifier apparatus of claim 2 wherein the control circuit is further configured to:
determine that the at least one rIMD is caused by a reverse interference signal received via the antenna port; and
control the reverse coupling circuit to generate the interference cancellation signal having an opposing phase and a proportional amplitude relative to the reverse interference signal;
wherein the interference cancellation signal is amplified by the amplifier circuit with the RF signal to create at least one intermodulation product (IMD) to suppress the rIMD to the defined threshold.

7. The power amplifier apparatus of claim 6 wherein the reverse coupling circuit comprises:
a first directional coupler coupled to the antenna port and configured to couple the reverse interference signal from the antenna port to the reverse coupling circuit;

a phase shifter coupled to the first directional coupler;
an attenuator coupled to the phase shifter; and
a second directional coupler coupled between the attenuator and the amplifier input, the second directional coupler configured to couple the interference cancellation signal to the amplifier input.

8. The power amplifier apparatus of claim 7 wherein the reverse coupling circuit further comprises a filter coupled between the first directional coupler and the phase shifter.

9. The power amplifier apparatus of claim 8 wherein the control circuit is further configured to adjust the phase shifter and the attenuator to convert the reverse interference signal into the interference cancellation signal having the opposing phase and the proportional amplitude relative to the reverse interference signal.

10. The power amplifier apparatus of claim 6 wherein the reverse coupling circuit comprises:
a first directional coupler coupled to the antenna port and configured to couple the reverse interference signal from the antenna port to the reverse coupling circuit;
a filter coupled to the first directional coupler;
a phase shifter coupled to the filter;
an attenuator coupled to the phase shifter; and
a coupling element coupled between the attenuator and the amplifier input, wherein the coupling element is selected from the group consisting of: a capacitor, a resistor, and an inductor, and configured to couple the interference cancellation signal to the amplifier input.

11. The power amplifier apparatus of claim 6 wherein the reverse coupling circuit comprises:
a first directional coupler coupled to the antenna port and configured to couple the reverse interference signal from the antenna port to the reverse coupling circuit;
a tunable notch filter coupled to the first directional coupler and configured to block a leakage of the RF signal coupled from the antenna port to the reverse coupling circuit;
a filter coupled to the first directional coupler;
a phase shifter coupled to the filter;
an attenuator coupled to the phase shifter; and
a second directional coupler coupled between the attenuator and the amplifier input, the second directional coupler configured to couple the interference cancellation signal to the amplifier input.

12. The power amplifier apparatus of claim 6 wherein the reverse coupling circuit comprises:
a first directional coupler coupled to the antenna port and configured to couple the reverse interference signal from the antenna port to the reverse coupling circuit;
a tunable filter coupled to the first directional coupler;
an attenuator coupled to the tunable filter; and
a second directional coupler coupled between the attenuator and the amplifier input, the second directional coupler configured to couple the interference cancellation signal to the amplifier input.

13. The power amplifier apparatus of claim 12 wherein the control circuit is further configured to adjust the tunable filter and the attenuator to convert the reverse interference signal into the interference cancellation signal having the opposing phase and the proportional amplitude relative to the reverse interference signal.

14. The power amplifier apparatus of claim 6 wherein the reverse coupling circuit comprises:
a first directional coupler coupled to the antenna port and configured to couple the reverse interference signal from the antenna port to the reverse coupling circuit;
a fixed filter coupled to the first directional coupler;
an attenuator coupled to the fixed filter; and
a second directional coupler coupled between the attenuator and the amplifier input, the second directional coupler configured to couple the interference cancellation signal to the amplifier input.

15. The power amplifier apparatus of claim 14 wherein the control circuit is further configured to pre-configure the fixed filter and adjust the attenuator to convert the reverse interference signal into the interference cancellation signal having the opposing phase and the proportional amplitude relative to the reverse interference signal.

16. The power amplifier apparatus of claim 6 wherein:
the amplifier output is coupled to the antenna port via a transmit filter; and
the reverse coupling circuit comprises:
a first directional coupler coupled to the antenna port via the transmit filter, the first directional coupler configured to couple the reverse interference signal from the antenna port to the reverse coupling circuit;
a tunable filter coupled to the first directional coupler and configured to pass exclusively the reverse interference signal;
an attenuator coupled to the tunable filter; and
a second directional coupler coupled between the attenuator and the amplifier input, the second directional coupler configured to couple the interference cancellation signal to the amplifier input.

17. The power amplifier apparatus of claim 2 further comprising:
a tracker circuit configured to:
generate an envelope tracking (ET) modulated voltage based on a target voltage; and
provide the ET modulated voltage to the amplifier circuit for amplifying the RF signal; and
a transceiver circuit configured to:
generate and provide the target voltage to the tracker circuit; and
receive and provide the RF signal to the amplifier circuit.

18. The power amplifier apparatus of claim 17 wherein the transceiver circuit comprises a signal combiner coupled to the amplifier input, the signal combiner configured to combine the RF signal and the interference cancellation signal.

19. The power amplifier apparatus of claim 18 wherein the reverse coupling circuit is integrated with the transceiver circuit.

20. The power amplifier apparatus of claim 2 wherein:
the at least one rIMD comprises a third order rIMD (rIMD3); and
the reverse coupling circuit is activated to generate and provide the interference cancellation signal to the amplifier input to suppress the rIMD3 to the defined threshold.

* * * * *